United States Patent
Huang et al.

(10) Patent No.: US 12,419,115 B2
(45) Date of Patent: Sep. 16, 2025

(54) ELECTROSTATIC DISCHARGE PROTECTION CIRCUIT

(71) Applicant: Vanguard International Semiconductor Corporation, Hsinchu (TW)

(72) Inventors: Shao-Chang Huang, Hsinchu (TW); Kai-Chieh Hsu, Taoyuan (TW); Chi-Hung Lo, Zhudong Township (TW); Wei-Sung Chen, Zhubei (TW); Chieh-Yao Chuang, Kaohsiung (TW); Hsien-Feng Liao, Taichung (TW); Yeh-Ning Jou, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 609 days.

(21) Appl. No.: 17/720,924

(22) Filed: Apr. 14, 2022

(65) Prior Publication Data
US 2023/0335546 A1    Oct. 19, 2023

(51) Int. Cl.
*H10D 89/60*    (2025.01)

(52) U.S. Cl.
CPC ......... *H10D 89/611* (2025.01); *H10D 89/814* (2025.01); *H10D 89/911* (2025.01)

(58) Field of Classification Search
CPC ............. H01L 27/0255; H01L 27/0274; H01L 27/0288
See application file for complete search history.

(56) References Cited

U.S. PATENT DOCUMENTS

| | | | | |
|---|---|---|---|---|
| 6,327,126 B1 * | 12/2001 | Miller | ...... | H02H 9/00 |
| | | | | 361/56 |
| 8,705,217 B2 * | 4/2014 | Guedon | ...... | H02H 9/00 |
| | | | | 361/56 |
| 9,634,483 B2 * | 4/2017 | Huang | ...... | H02H 3/22 |
| | | | | 361/56 |
| 2020/0083704 A1 * | 3/2020 | Huang | ...... | H02H 9/04 |

FOREIGN PATENT DOCUMENTS

TW        577165 B    *    2/2004

OTHER PUBLICATIONS

Wikipedia Article on CMOS Inverters, Aug. 31, 2024, p. 1 (Year: 2024).*

* cited by examiner

*Primary Examiner* — Sean Kayes
*Assistant Examiner* — Samantha L Faubert
(74) *Attorney, Agent, or Firm* — Birch, Stewart, Kolasch & Birch, LLP

(57) ABSTRACT

An ESD protection circuit includes a buffer circuit, a driving circuit, and a power-clamping circuit. The buffer circuit includes first and second transistors having a first conductivity type coupled in a cascade configuration between a first node and a first power supply node. A bonding pad is coupled to the first node. The drive circuit determines a state of at least one of the first and second transistors according to a control voltage. The drive circuit includes a third transistor having a second conductivity type, which is coupled between a second power supply node and a gate of the first transistor and is controlled by the control signal. The power-clamping circuit is coupled to the bonding pad and a gate of the third transistor at a second node. The control voltage is generated at the second node and determined by a voltage at the bonding pad.

15 Claims, 11 Drawing Sheets

ELECTROSTATIC DISCHARGE PROTECTION CIRCUIT

BACKGROUND OF THE DISCLOSURE

Field of the Disclosure

The present disclosure relates to an electrostatic discharge protection circuit, and more particularly to an electrostatic discharge protection circuit with high voltage tolerance.

Description of the Related Art

With development of semiconductor manufacture processes of integrated circuits, the size of semiconductor components has been reduced to the sub-micron level to improve the performance and operation speed of the integrated circuits. However, the reduction of the size of the components has caused some reliability problems. This is particularly true for integrated circuits, in which the protection against electrostatic discharge (ESD) is seriously affected. In general, a bonding pad for input/output can be coupled to a buffer circuit with high voltage tolerance. When an ESD event occurs on the bonding pad, an ESD current can be conducted to the ground through N-type metal-oxide-semiconductor field-effect transistors connected in series in the buffer circuit, thereby preventing the components coupled to the bonding pad from being damaged by the ESD current. Therefore, the electrostatic discharging capability of the buffer circuit is really important.

BRIEF SUMMARY OF THE DISCLOSURE

An exemplary embodiment of the present disclosure provides an electrostatic discharge protection circuit. The electrostatic discharge protection circuit is coupled to a bonding pad and comprises a buffer circuit, a drive circuit, and a power-clamping circuit. The buffer circuit comprises a first transistor and a second transistor having a first conductivity type, which are coupled in a cascade configuration between a first node and a first power supply node. The bonding pad is coupled to the first node. The drive circuit receives a first control voltage and determines a state of at least one of the first transistor and the second transistor according to the first control voltage. The drive circuit comprises a third transistor having a second conductivity type. The third transistor is coupled between a second power supply node and a gate of the first transistor and is controlled by the first control voltage. The power-clamping circuit is coupled to the bonding pad through the first node and coupled to a gate of the third transistor at a second node. The first control voltage is generated at the second node. The power-clamping circuit determines a level of the first control voltage according to a voltage on the bonding pad.

Another exemplary embodiment of the present disclosure provides an electrostatic discharge protection circuit. The electrostatic discharge protection circuit is coupled to a bonding pad and comprises a buffer circuit, a drive circuit, and a power-clamping circuit. a buffer circuit comprises a first transistor and a second transistor which have a first conductivity type. The first transistor is coupled between a first node and a second node. The bonding pad is coupled to the first node. The second transistor is coupled between the second node and a first power supply node. The drive circuit receives a first control voltage and determines a state of at least one of the first transistor and the second transistor according to the first control voltage. The power-clamping circuit is coupled to the bonding pad through the first node and coupled to the drive circuit at a third node. The first control voltage is generated at the third node, and the power-clamping circuit determines a level of the first control voltage according to a voltage on the bonding pad. In response to an electrostatic discharge event occurring on the bonding pad, the drive circuit turns off the first transistor according to the first control voltage.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION OF THE DISCLOSURE

The following description is a best-contemplated model of carrying out the disclosure. This description is made for the purpose of illustrating the general principles of the disclosure and should not intended to be limiting.

Figure 1:
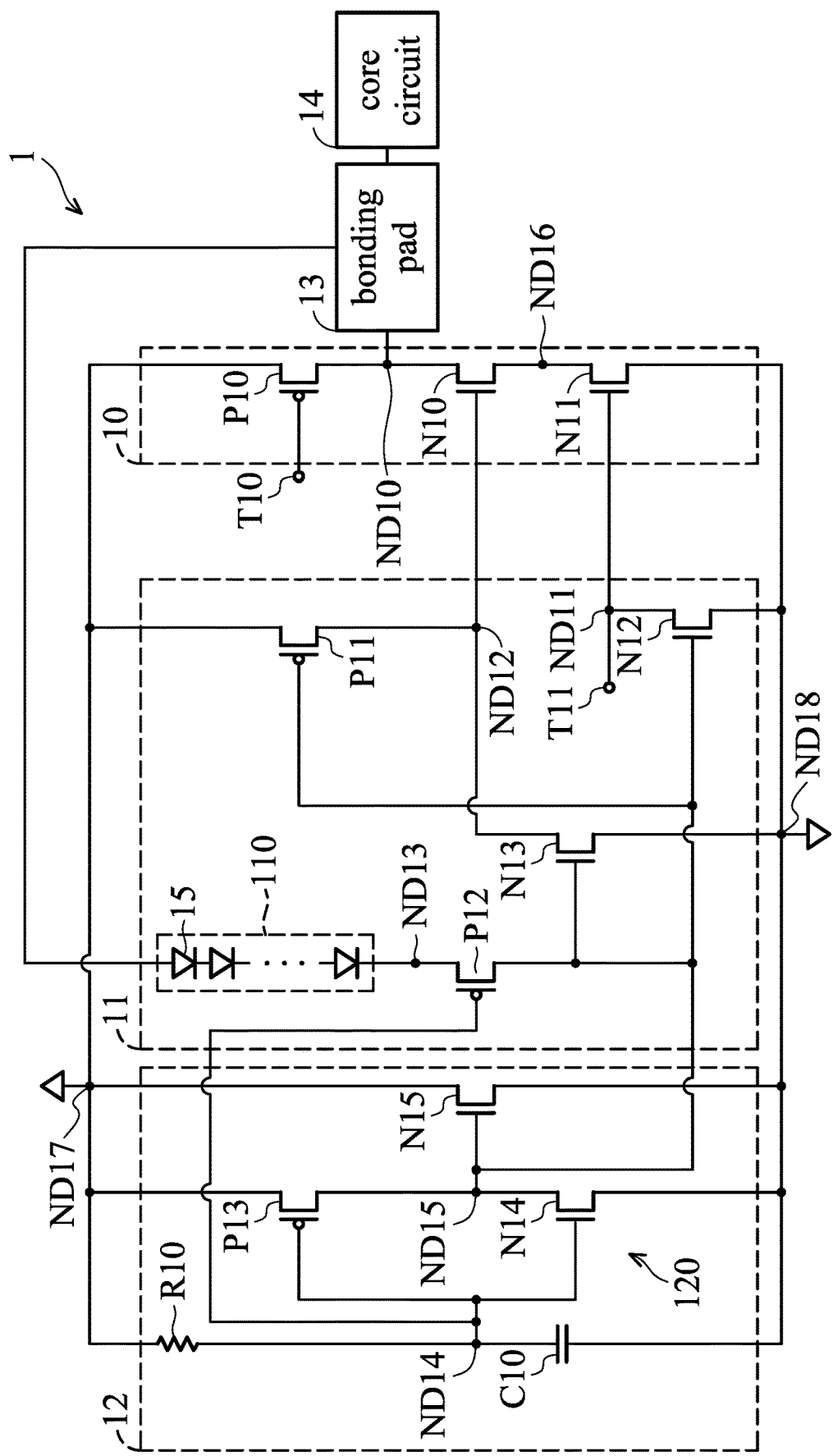
FIG. 1 shows an electrostatic discharge protection circuit according to one exemplary embodiment of the present disclosure.

FIG. 1 shows an electrostatic discharge protection circuit according to one exemplary embodiment of the present disclosure. Referring to FIG. 1, for the purpose of detailed description, in addition to an electrostatic discharge protection circuit 1, FIG. 1 also shows a bonding pads 13 and a core circuit 14. As shown in FIG. 1, the electrostatic discharge protection circuit 1 comprises two power supply nodes ND17 and ND18 and is coupled to the bonding pad 13 at a node ND10. The electrostatic discharge protection circuit 1 is coupled to the core circuit 14 through the bonding pad 13. In one embodiment, when the core circuit 14 operates in a normal operation state, the power supply node ND17 receives an operation voltage, and the power supply node ND18 receives another operation voltage; when an electrostatic discharge event occurs on the bonding pad 13, the power supply nodes ND17 and ND18 do not receive any operation voltages. In another embodiment, the power supply node ND18 is coupled to the ground, so the operation voltage received by the power supply node ND18 is a around voltage, for example, 0 volts (V). The operation of the electrostatic discharge protection circuit 1 will be described in the following paragraphs with reference to the drawings.

The electrostatic discharge protection circuit 1 comprises a buffer circuit 10, a drive circuit 11, and a power-clamping circuit 12. The buffer circuit 10 comprises metal-oxide-semiconductor (MOS) transistors N10, N11, and P10. In the embodiment, the conductivity type of the MOS transistors N10 and N11 is N-type (first conductivity type), and the conductivity type of the MOS transistor P10 is P-type (second conductivity type). In the specification of the present application, N-type MOS transistor (that is, an MOS transistor with the first conductivity type) is referred to as an NMOS transistor, and a P-type MOS transistor (that is, a MOS transistor with the second conductivity type) is referred to as a PMOS transistor. Referring to FIG. 1, the source of the PMOS transistor P10 is coupled to the power supply node ND17, the drain thereof is coupled to the node ND10, and the gate thereof is coupled to a control terminal T10. The drain of the NMOS transistor N10 is coupled to the node ND10; the source thereof is coupled to a node ND16, and the gate thereof is coupled to a node ND12. The drain of the NMOS transistor N11 is coupled to the node ND16, the source thereof is coupled to the power supply node ND18, and the gate thereof is coupled to the control terminal T11. When the core circuit 14 operates in a normal operation state, the gate of the PMOS transistor P10 receives a signal voltage through the control terminal T10, and the gate of the NMOS transistor N11 receives another signal voltage through the control terminal T11.

As shown in FIG. 1, the drive circuit 11 comprises a voltage-lowering circuit 110, PMOS transistors P11 and P12, and NMOS transistors N12 and N13. The voltage-lowering circuit 110 is coupled between the bonding pad 13 and a node ND13. The voltage-lowering circuit 110 provides a regulation voltage and lowers the voltage on the bonding pad 13 by the regulation voltage, such that the voltage on the node ND13 is lower than the voltage on the bonding pad 13. The voltage-lowering circuit 110 comprises a plurality of voltage-lowering elements coupled in a cascade configuration between the bonding pad 13 and the node ND13. In the embodiment, the voltage-lowering circuit 110 comprises a plurality of diodes 15 coupled in a cascade configuration between the bonding pad 13 and the node ND13. The actual number of diodes 15 can be adjusted according to actual requirements, and the present disclosure does not intend limiting the number of diodes 15. Among the diodes 15 coupled in the cascade configuration in sequence from the bonding pad 13 to the node ND13, the anode terminal of the first diode 15 is coupled to the bonding pad 13, and the anode terminal of each of the remaining diodes 15 is coupled to the cathode terminal of the previous diode 15, and the cathode terminal of the last diode 15 is coupled to the node ND13. The magnitude of the regulation voltage is determined according to the number of diodes 15.

The source of the PMOS transistor P12 is coupled to the node ND13, the drain thereof is coupled to the power-clamping circuit 12 at a node ND15, and the gate thereof is coupled to the power-clamping circuit 12 at a common node ND14. The source of the PMOS transistor P11 is coupled to the power supply node ND17, the drain thereof is coupled to the gate of the NMOS transistor N10 at the node ND12, and the gate thereof is coupled to the power-clamping circuit 12 at the node ND15. The drain of the NMOS transistor N13 is coupled to the gate of the NMOS transistor N10 at the node ND12, the source thereof is coupled to the power supply node ND18, and the gate thereof is coupled to the power-clamping circuit 12 at the node ND15. The drain of the NMOS transistor N12 is coupled to the gate of the NMOS transistor N11 and the control terminal T11 at a node ND11, the source thereof is coupled to the power supply node ND18, and the gate thereof is coupled to the power-clamping circuit 12 at the node ND15.

Referring to FIG. 1, the power-clamping circuit 12 comprises a resistor R10, a capacitor C10, a PMOS transistor P13 serving as a pull-up transistor, an NMOS transistor N14 serving as a pull-down transistor, and an NMOS transistor N15. The resistor R10 is coupled between the power supply node ND17 and the common node ND14, and the capacitor C10 is coupled between the common node ND14 and the power supply node ND18. The source of the PMOS transistor P13 is coupled to the power supply node ND17, the drain thereof is coupled to the node ND15, and the gate thereof is coupled to the common node ND14. The drain of the NMOS transistor N14 is coupled to the node ND15, the source thereof is coupled to the power supply node ND18, and the gate thereof is coupled to the common node ND14. According to the connection structure of the PMOS transistor P13 and the NMOS transistor N14, the PMOS transistor P13 and the NMOS transistor N14 form an inverter 120. The drain of the NMOS transistor N15 is coupled to the power supply node ND17, the source thereof is coupled to the power supply node ND18, and the gate thereof is coupled to the node ND15.

According to the embodiment of the present application, the power-clamping circuit 12 is coupled to the bonding pad 13 through the power supply node ND17 and the PMOS transistor P10. The power-clamping circuit 12 generates at least one control voltage according to the voltage on the bonding pad 13, and the drive circuit 11 determines the on/off state of at least one of the NMOS transistors N10 and N11 according to the at least one control voltage. In particular, during the period when the core circuit 14 does not operate in the normal operation state, when an electrostatic discharge event occurs on the bonding pad 13, the drive circuit 11 turns off at least one of the NMOS transistors N10 and N11 according to the at least one control voltage. The detailed operation of the electrostatic discharge protection circuit 1 will be illustrated by referring to the following paragraphs and the related drawings.

Figure 2A:
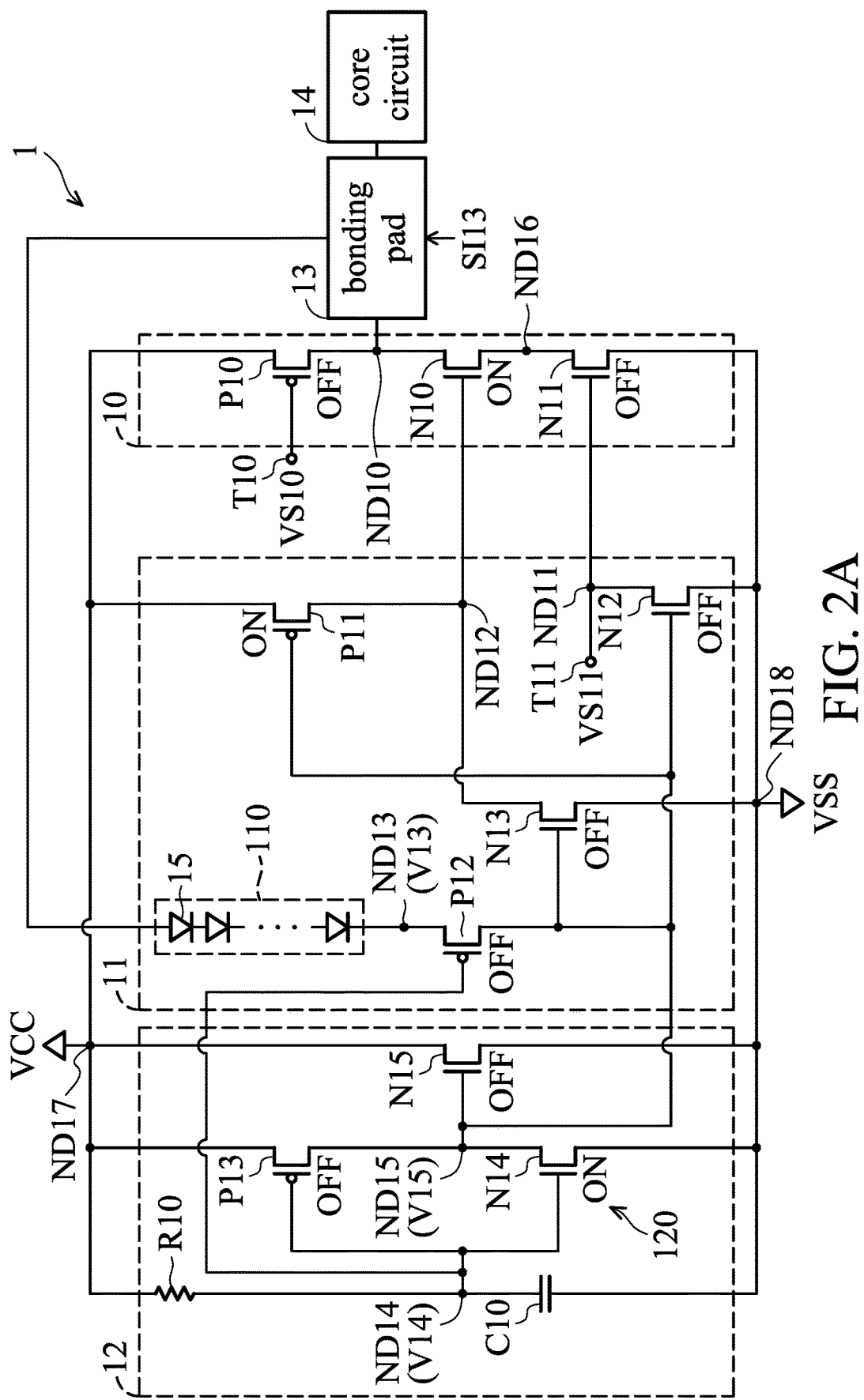
FIG. 2A is a schematic diagram showing an operation of the electrostatic discharge protection circuit of FIG. 1 in an input mode.

When the core circuit 14 operates in the normal operation state, the power supply node ND17 receives an operation voltage VCC, and the power supply node ND18 receives an operation voltage VSS or is coupled to the ground. In the embodiment, the level of the operation voltage VSS is lower than the level of the operation voltage VCC. For example, the operation voltage VCC is 3.3V, and the operation voltage VSS is 0V. Alternatively, the power supply node ND18 is coupled to the ground. In the case where the power supply node ND18 is coupled to the ground, the operation voltage VSS is regarded as a ground voltage (0V). In the normal operation state, the core circuit 14 may be in an input mode or an output mode. FIG. 2A is a schematic diagram showing the operation of the electrostatic discharge protection circuit 1 in the input mode. In the input mode, the bonding pad 13 receives an input signal SI13, a signal voltage VS10 is provided to the control terminal T10, and a signal voltage VS11, which is equal to 0V, is provided to the control terminal T11. For example, the signal voltages VS10 and VS11 are provided by the core circuit 14, however, the present disclosure is not limited thereto. In an embodiment, the signal voltages VS10 and VS11 are required signal voltages provided by different circuits. Assuming that the core circuit 14 is composed of components having a withstanding voltage of 5V, in the input mode, the voltage level of the input signal SI13 is in the range of 0V~3.3V or in the range of 0V~5V, and the signal voltage VS10 is 3.3 V or 5V, Specifically, in the input mode, the voltage level of the input signal SI13 is in the range of 0V~3.3V and the signal voltage VS10 is 3.3V, or the voltage level of the input signal SI13 is in the range of 0V~5V and the signal voltage VS10 is 5V. In the following, the operation of the electrostatic discharge protection circuit 1 in the input mode will be described by taking the voltage level of the input signal SI13 in the range of 0V to 3.3V and the signal voltage VS10 of 3.3V as an example.

Figure 2B:
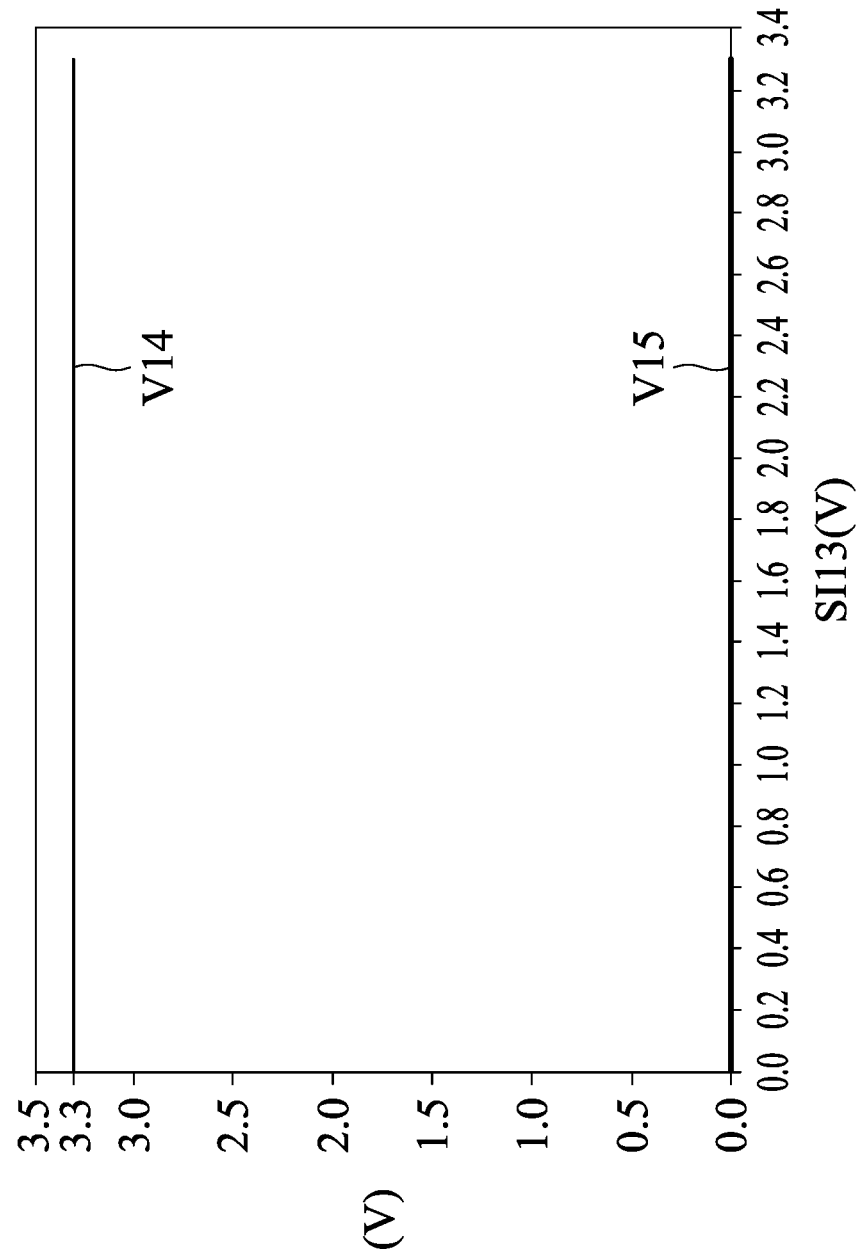
FIG. 2B shows a schematic diagram showing levels of main voltages/signals of the electrostatic discharge protection circuit of FIG. 1 in an input mode according to an exemplary embodiment of the present disclosure.

Referring to FIG. 2A, in the input mode, since the signal voltage VS10 is 3.3V and the signal voltage VS11 is 0V, the PMOS transistor P10 and the NMOS transistor N11 are turned off (OFF). The operation voltage VCC on the power supply node ND17 charges the capacitor C10 through the resistor R10, such that a control voltage V14 on the node ND14 is close to or equal to the operation voltage VCC and, thus, has a high level. The inverter 120 generates a control voltage V15 having a low level on the node ND15 according to the high-level control voltage V14 on the common node ND14. In details, according to the high-level control voltage V14 on the common node ND14, the NMOS transistor N14 is turned on (ON) while the PMOS transistor P13 is turned off. Therefore, the control voltage V15 on the node ND15 is close to or equal to the operation voltage VSS and, thus, has the low level. The NMOS transistor N15 is turned off according to the low-level control voltage V15. Referring to FIG. 2B, in response to signal simulation applied on the electrostatic discharge protection circuit 1 of the present application, when the voltage level of the input signal SI13 (represented by the X axis) is in the range of 0V~3.3V, the control voltage V14 is close to or equal to 3.3V (operation voltage VCC), and control voltage V15 is close to or equal to 0V (operation voltage VSS).

As shown in FIG. 2A, the voltage-lowering 110 provides the regulation voltage through the diodes 15 coupled in the cascade configuration, such that the voltage on the node ND13 is lower than the voltage on the bonding pad 13 (i.e., the voltage level of the input signal SI13). Since the gate of the PMOS transistor P12 is coupled to the node ND14, the PMOS transistor P12 is turned off according to the high-level control voltage V14. According to the low-level control voltage V15 on the node ND15, the NMOS transistors N12 and N13 are turned off, while the PMOS transistor P11 is turned on. In response to the turned-on state of the PMOS transistor P11, a voltage on the node ND12 is close to or equal to the operation voltage VCC (3.3V) and, thus, has a high level to turn on the NMOS transistor N10. Moreover, since the NMOS transistor N12 is turned off, the NMOS transistor N11 can be turned off certainty according to the signal voltage VS11.

According to the operation of the electrostatic discharge protection circuit 1 in the input mode, since the PMOS transistor P10 and the NMOS transistor N11 of the buffer circuit 10 are turned off, the input signal SI13 input to the bonding pad 13 can be transmitted to the core circuit 14 without being affected by the components in the electrostatic discharge protection circuit 1. Moreover, even if the voltage level of the input signal SI13 is the maximum (3.3V) in the range of 0V to 3.3V, since to both of the gate-drain voltage of the PMOS transistor P10 (the voltage difference between the signal voltage VS10 and the voltage on the node ND10) and the gate-source voltage of NMOS transistor N10 (the voltage difference between nodes ND12 and ND10) are close to or equal to 0V, the oxide layers of the PMOS transistor P10 and the NMOS transistor N10 do not suffer breakdown.

Figure 2C:
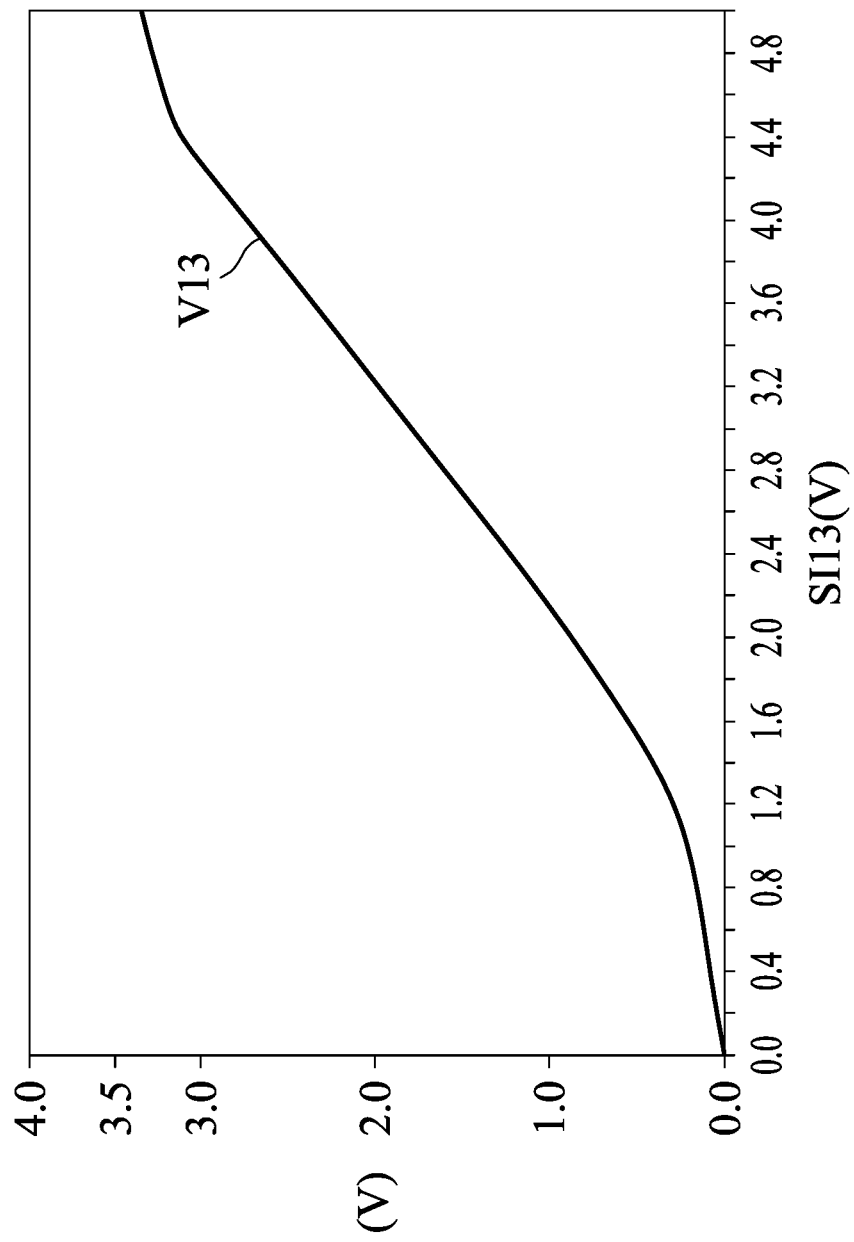
FIG. 2C shows a schematic diagram showing levels of main voltages/signals of the electrostatic discharge protection circuit of FIG. 1 in an input mode according, to another embodiment of the present disclosure.

The above embodiment describes the operation of the electrostatic discharge protection circuit 1 in the input mode when the voltage level of the input signal SI13 is in the range of 0V to 3.3V and the signal voltage VS10 is about 3.3V. For an case in which the voltage level of the input signal SI13 is in the range of 0V to 5V and the signal voltage VS10 is about 5V, the respective components in the electrostatic discharge protection circuit 1 of the present application operate in the same manner as the above embodiment. For example, the on/off state of each transistor in the electrostatic discharge protection circuit 1 is the same as that in the above embodiment. Referring to FIG. 2C, when the voltage level of the input signal SI13 is the maximum (5V) in the range of 0V to 5V, the voltage V13 on the node ND13 is about 3.3V. Accordingly, the PMOS transistor P12 can still be turned off according to the high-level control voltage V14.

Figure 3A:
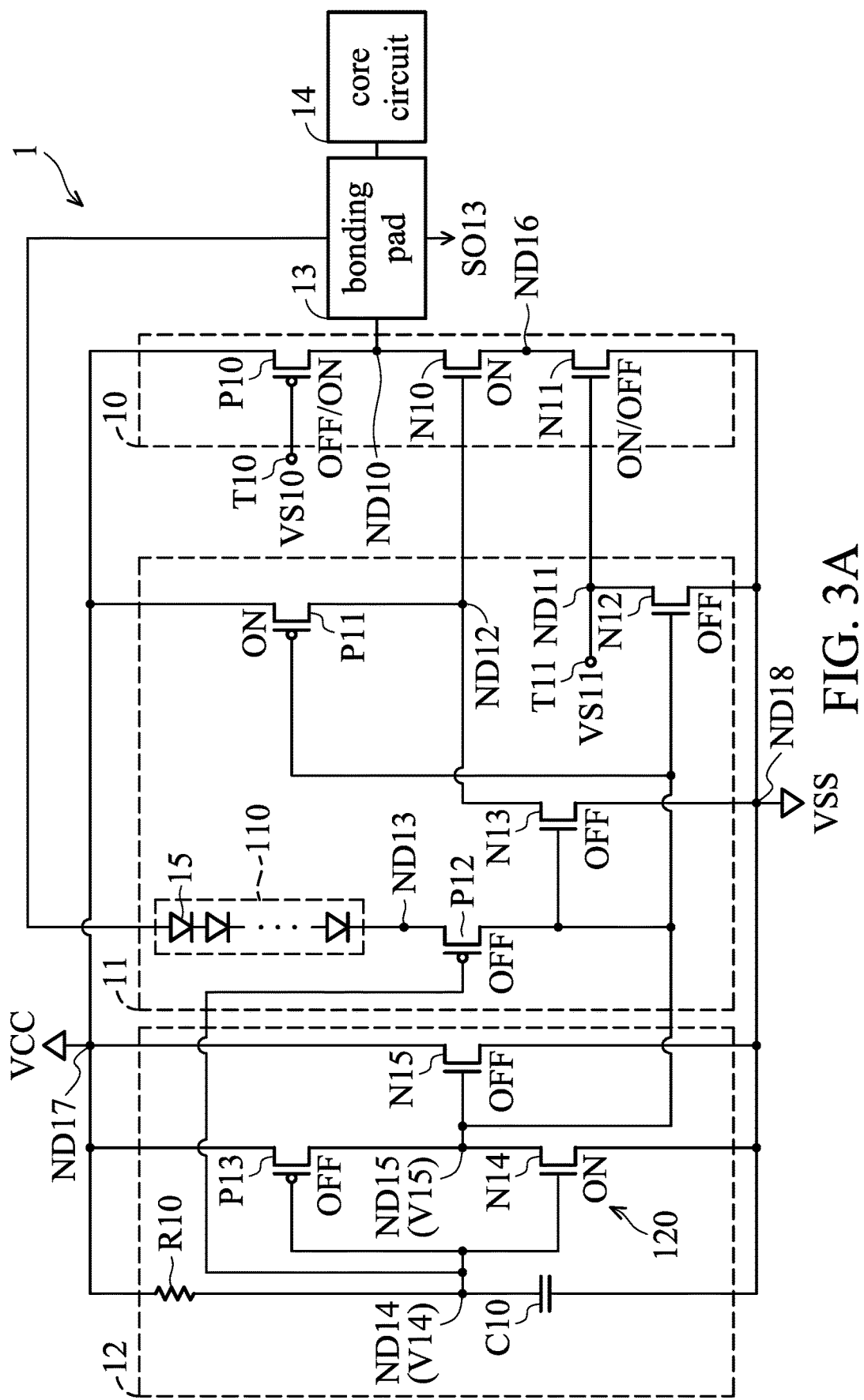
FIG. 3A is a schematic diagram showing an operation of the electrostatic discharge protection circuit of FIG. 1 in an output mode.

FIG. 3A is a schematic diagram showing the operation of the electrostatic discharge protection circuit 1 in the output mode. During the period when the core circuit 14 is in the output mode, the power supply node ND17 receives the operation voltage VCC (3.3V), and the power supply node ND18 receives the operation voltage VSS (0V) or is coupled to ground. In the output mode, the core circuit 14 provides the signal voltages VS10 and VS11 having the same level according to its operation. The operation voltage VCC on the power supply node ND17 charges the capacitor C10 through the resistor R10, such that the control voltage V14 on the node ND14 is close to or equal to the operation voltage VCC and, thus, has a high level. According to the high-level voltage V14, the NMOS transistor N14 is turned on, and the PMOS transistor P13 is turned off. Thus, the control voltage V15 on the node ND15 is close to or equal to the operation voltage VSS and, thus, has a low level. The NMOS transistor N15 is turned off according to the low level control voltage V15. In response to signal simulation applied on the electrostatic discharge protection circuit 1 of the present application, the levels of the control voltages V14 and V15 in the output mode are the same as the levels of the control voltages V14 and V15 in the input mode (as shown in FIG. 2B).

As shown in FIG. 3A, the voltage-lowering 110 provides the regulation voltage through the diodes 15 coupled in the cascade configuration, such that the voltage on the node ND13 is lower than the voltage on the bonding pad 13 (i.e., a voltage level of an output signal SO13). The PMOS transistor P12 is turned off according to the high-level control voltage V14. According to the low-level control voltage V15 on the node ND15, the NMOS transistors N12 and N13 are turned off, while the PMOS transistor P11 is turned on. In response to the turned-on state of the PMOS transistor P11, the voltage on the node ND12 is close to or equal to the operation voltage VCC (3.3V) and, thus, has a high level to turn on the NMOS transistor N10. Moreover, since the NMOS transistor N12 is turned off, the NMOS transistor N11 can be turned on or off certainly according to the signal voltage VS11.

Figure 3B:
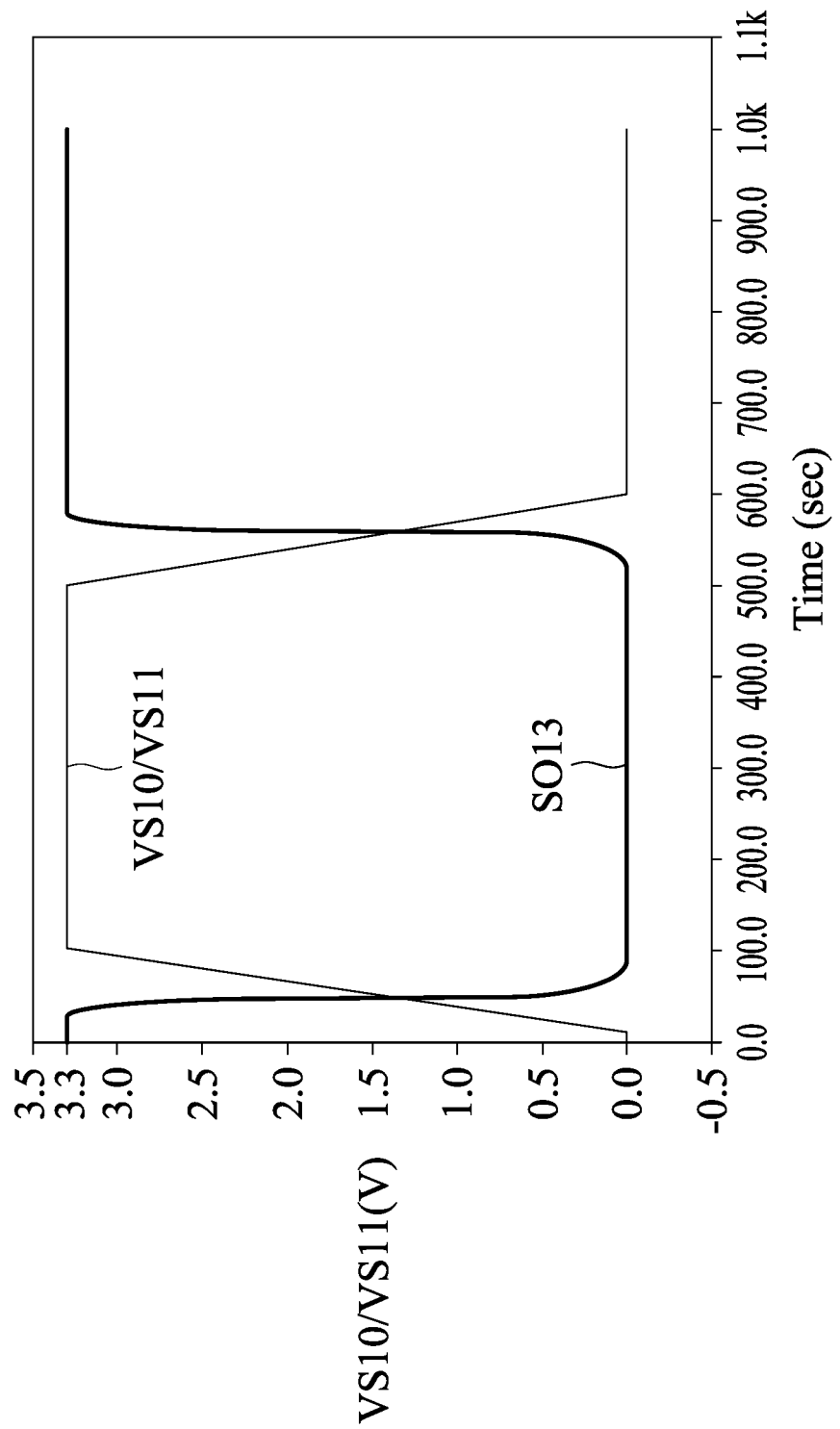
FIG. 3B shows a schematic diagram showing levels of main voltages/signals of the electrostatic discharge protection circuit of FIG. 1 in an output mode according to an exemplary embodiment of the present disclosure.

In the output mode, the core circuit 14 provides the signal voltages VS10 and VS11 having the same level according to its operation. Referring to FIG. 3B, when both the signal voltages VS10 and VS11 are at a high level (for example, the signal voltages VS10 and VS11 are 3.3V), the NMOS transistor N11 is turned on, while the PMOS transistor P10 is turned off. At this time, the voltage on the node ND10 is pulled down to be close to or equal to the voltage VSS (0V) through the turned-on NMOS transistors N10 and N11. Thus, the voltage level of the output signal SO13 which is output through the bonding pad 13 is 0V. When both the signal voltages VS10 and VS11 are at a low level (for example, the signal voltages VS10 and VS11 are 0V), the PMOS transistor P10 is turned on, while the NMOS transistor N11 is turned off. At this time, the voltage on the node ND10 is pulled up to be close to or equal to the voltage VCC (3.3V) through the turned-on PMOS transistor P10. Thus, the voltage level of the output signal SO13 which is output through the bonding pad 13 is 3.3V.

According to the operation of the electrostatic discharge protection circuit 1 in the output mode, the drive circuit 11 controls the NMOS transistor N10 to be turned on, and the PMOS transistor P10 and the NMOS transistor N11 are in different on/off states according to the signal voltages VS10 and VS11. Thus, the voltage level of the output signal SO13 is opposite to the voltage levels of the signal voltages VS10 and VS11.

Figure 4A:
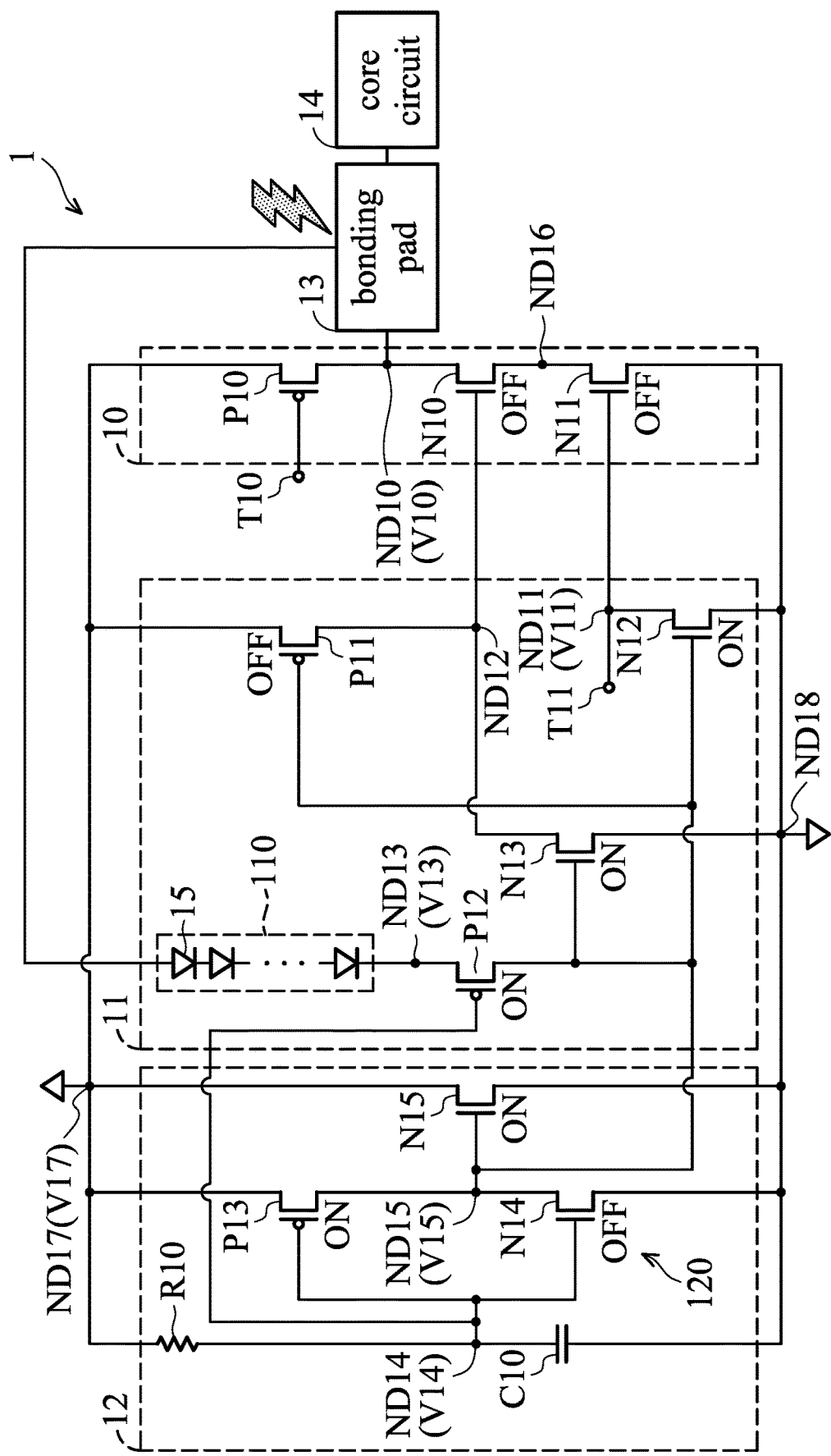
FIG. 4A is a schematic diagram showing an operation of the electrostatic discharge protection circuit of FIG. 1 when an electrostatic discharge event occurs on a bounding pad.

FIG. 4A is a schematic diagram showing the operation of the electrostatic discharge protection circuit 1 when an electrostatic discharge event occurs on the bonding pad 13. As shown in FIG. When the core circuit 14 does not operate in the normal operation state, the power supply node ND17 does not receive the operation voltage VDD and, thus, is at a low level, and the power supply node ND18 does not receive the operation voltage VSS or is coupled to the ground and, thus. is at a low level. Therefore, the voltages on the power supply nodes ND17 and ND18 are 0V. Moreover, the core circuit 14 does not provide the signal voltages VS10 and VS11 to the control terminals T10 and T11 respectively, and the bonding pad 13 does not output or receive any signals.

Figure 4B:
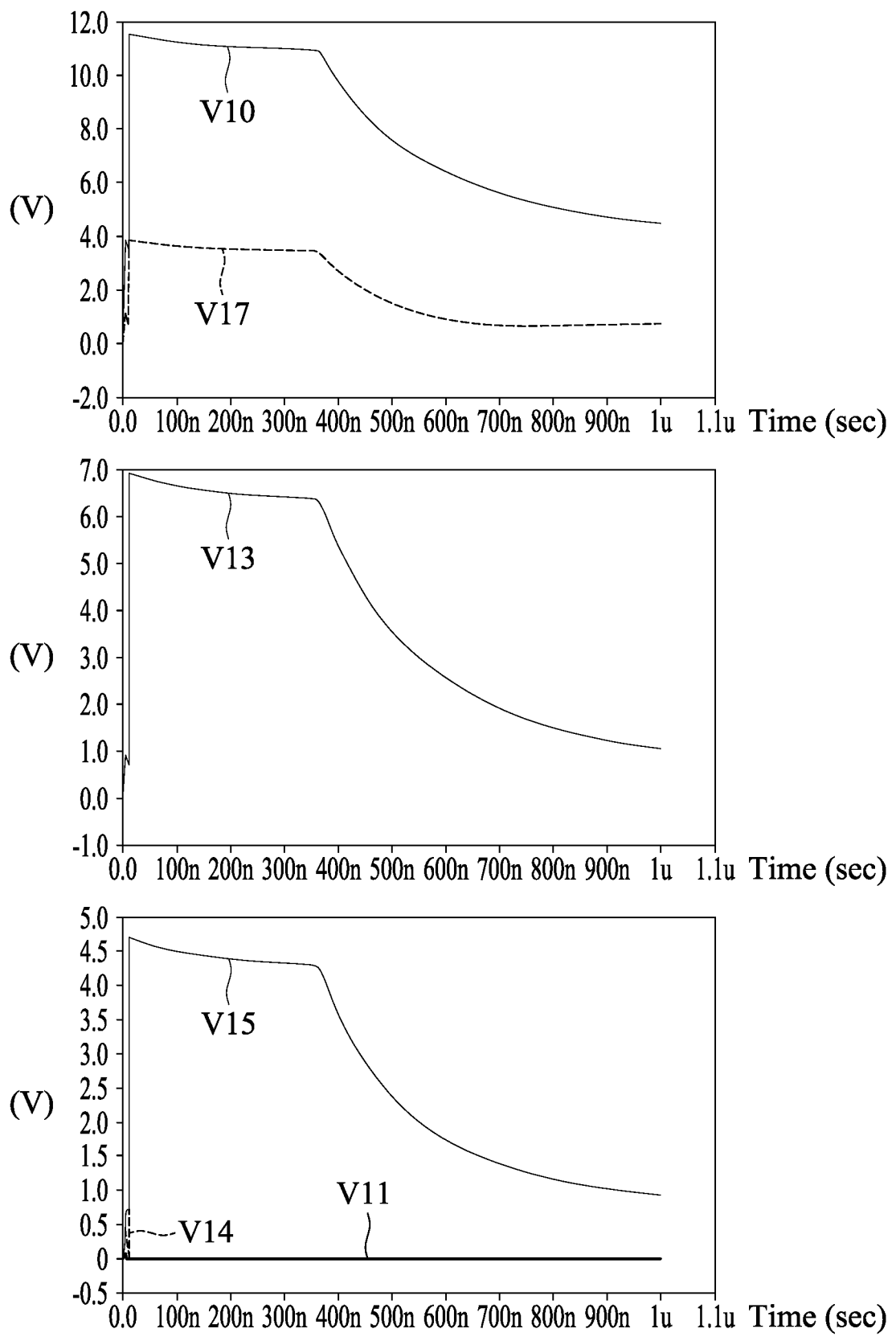
FIG. 4B shows a schematic diagram showing levels of main voltages/signals of the electrostatic discharge protection circuit of FIG. 1 when an electrostatic discharge event occurs on a bounding pad.

Referring to FIGS. 4A and 4B, when an electrostatic discharge event occurs on the bonding pad 13, the voltage V10 on the node ND10 increases instantaneously in response to the change in the voltage on the bonding pad 13 (or, at this time, the voltage V10 on the node ND10 is equal to the voltage on bonding pad 13). The PMOS transistor P10 is in a floating state at this time. Through a parasitic path formed by an parasitic element of the PMOS transistor P10, the voltage V17 on the power supply node ND17 increases instantaneously with the change in the voltage V10. Based on the element characteristics of the capacitor C10, the control voltage V14 on the common node ND14 has a low level. In response to the low-level voltage V14, the PMOS transistor P13 is turned on, while the NMOS transistor N14 is turned off. Therefore, the control voltage V15 on the node ND15 increases instantaneously with the increase in the voltage V17 to turn on the NMOS transistor N15. Due to the turned-on state of the N-MOS transistor N15, a discharge path is formed between the power supply nodes ND17 and ND18. Accordingly, the electrostatic charges on the bonding pad 13 are conducted to the power supply node ND18 (such as the ground) through the PMOS transistor P10 along the discharge path.

As shown in FIGS. 4A and 4B, the voltage-lowering circuit 110 lowers the voltage on the bonding pad 13 by the regulation voltage provided by the diodes 15 coupled in the cascade configuration. At this time, the voltage V13 on the node ND13 is lower than the voltage on the bonding pad 13 but still higher than the control voltage V14, such that the PMOS transistor P12 is turned on. Since both the PMOS transistors P12 and P13 are turned on, it is ensured that the control voltage V15 on the node ND15 can vary with the voltage V17. According to the high-level control voltage V15 on the node ND15, the NMOS transistors N12-N13 are turned on, while the PMOS transistor P11 is turned off. Since the PMOS transistor P11 is turned off and the NMOS transistor N13 is turned on, the voltage on the node ND12 is close to or equal to the voltage (0V) on the power supply node ND18 and, thus, has a low level to turn off the NMOS transistor N10. Moreover, since the NMOS transistor N12 is turned on, the voltage V11 on the node ND11 is close to or equal to the voltage (0V) on the power supply node ND18 and, thus, has a low level (as shown in FIG. 4B) to turn off the NMOS transistor N11.

According to the above embodiment, when an electrostatic discharge event occurs on the bonding pad 13, the drive circuit 11 forcibly turns off the NMOS transistors N10 and N11 according to the control voltages V14 and V15. Therefore, the electrostatic discharge current from the bonding pads 13 is conducted to the power supply node ND18 through the parasitic bipolar transistors formed between the NMOS transistors N10 and N11 and their bases, thereby improving the electrostatic discharge capability of the buffer circuit 10.

Figure 5:
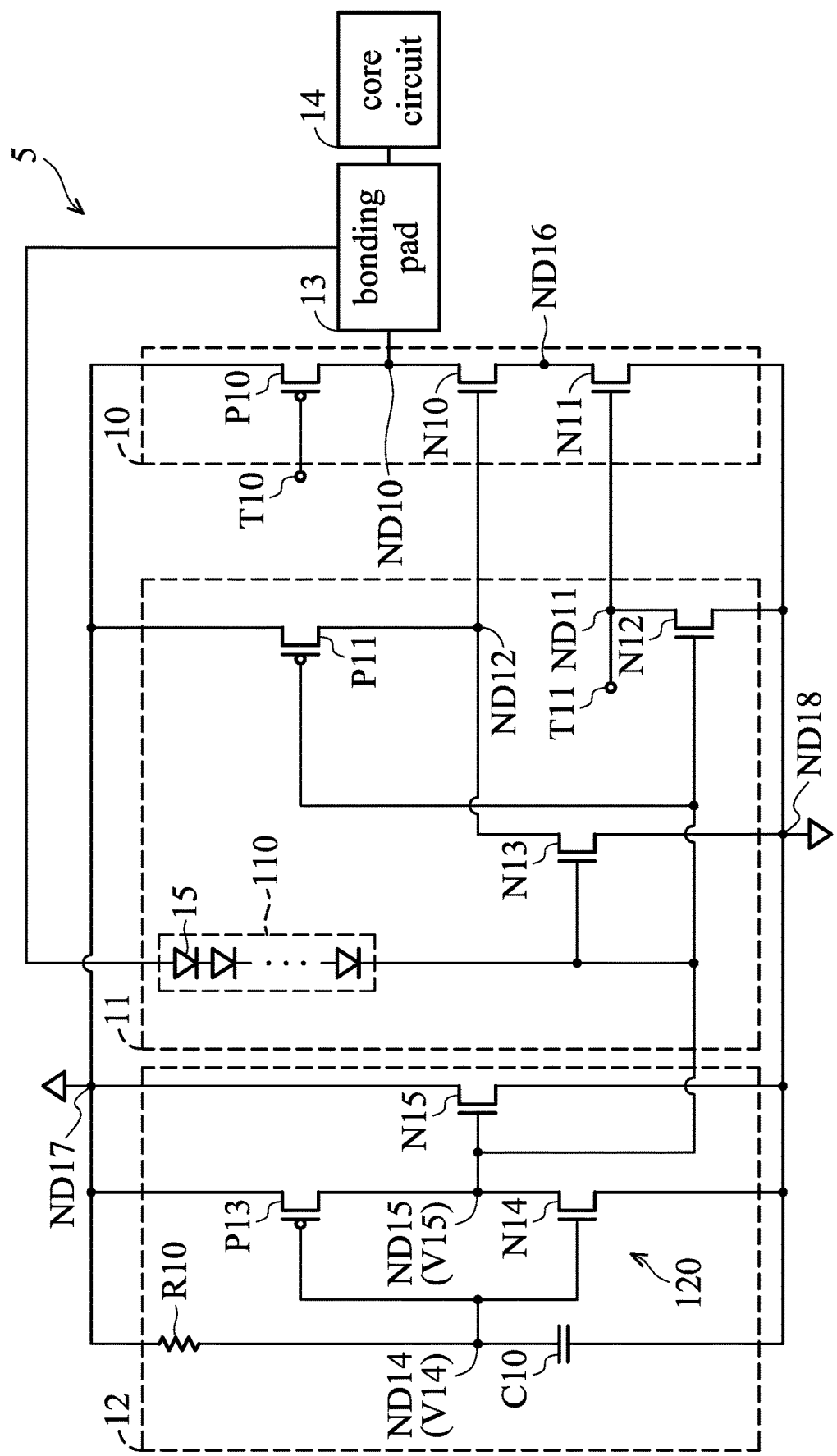
FIG. 5 shows an electrostatic discharge protection circuit according to an exemplary embodiment of the present disclosure.

FIG. 5 shows an electrostatic discharge protection circuit according to another embodiment of the present disclosure. Referring to FIG. 5, the circuit structure of the electrostatic discharge protection circuit 5 is similar to the circuit structure of the electrostatic discharge protection circuit 1 of FIG. 1. The electrostatic discharge protection circuit 5 is different from the electrostatic discharge protection circuit 1 in that the drive circuit 11 of the electrostatic discharge protection circuit 5 does not comprises the PMOS transistor P12 of the electrostatic discharge protection circuit 1. Even though the drive circuit 11 of the electrostatic discharge protection circuit 5 does not comprise the PMOS transistor P12, the operations of the buffer circuit 10, the other elements of the drive circuit 11, and the power-clamping circuit 12 are the same as the described operations related to FIGS. 2A-4B, and the related description is omitted here. According to the embodiment, since the drive circuit 11 of the electrostatic discharge protection circuit 5 does not comprise the PMOS transistor P12, when the core circuit 14 does not operate in the normal operating state and an electrostatic discharge event occurs on the bonding pad 13, the drive circuit 11 receives the control voltage V15 and operates according to the control voltage V15 to forcibly turn off the NMOS transistors N10 and N11.

Figure 6:
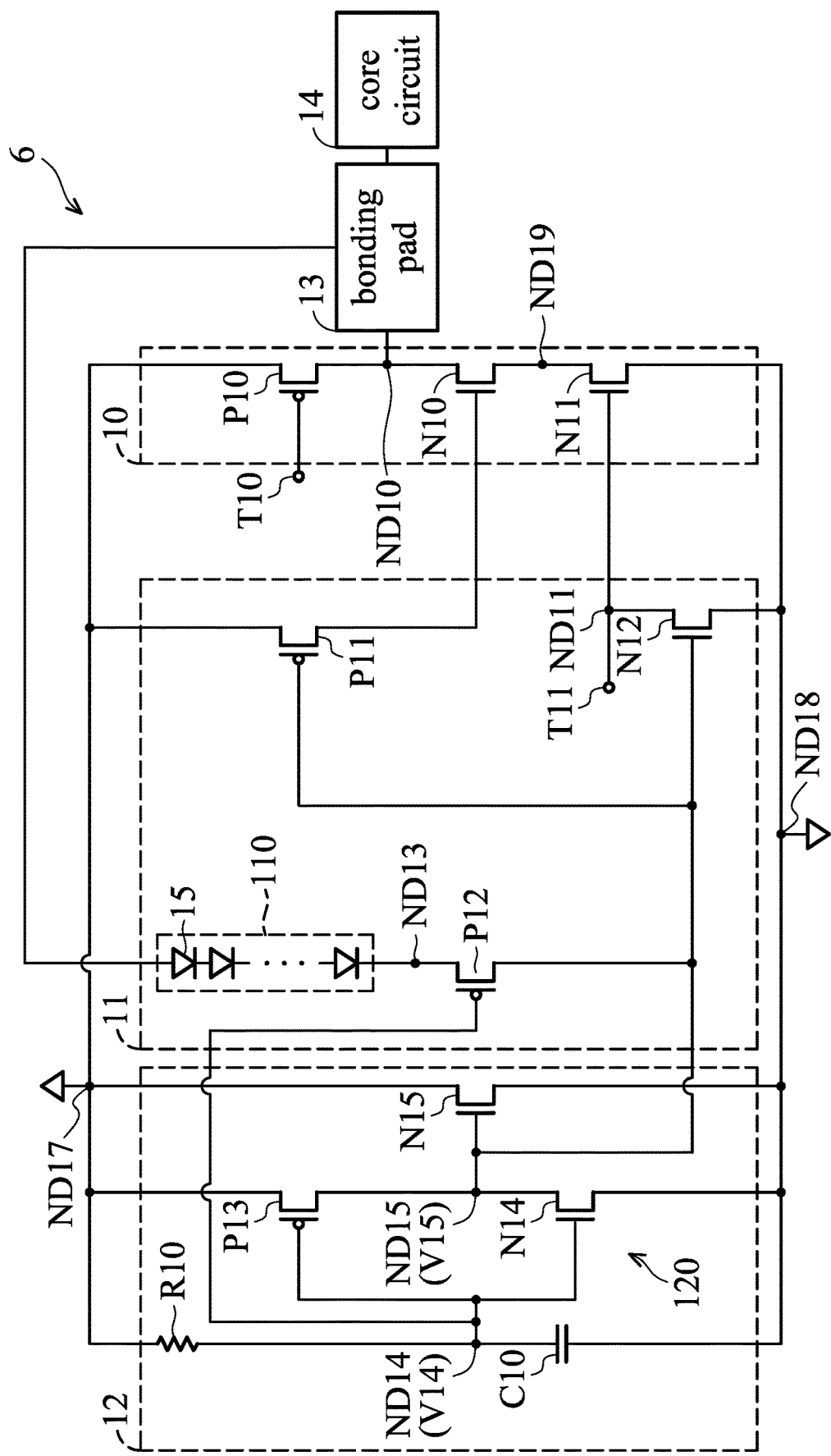
FIG. 6 shows an electrostatic discharge protection circuit according to an exemplary embodiment of the present disclosure.

FIG. 6 shows an electrostatic discharge protection circuit according to another embodiment of the present disclosure. Referring to FIG. 6, the circuit structure of the electrostatic discharge protection circuit 6 is similar to the circuit structure of the electrostatic discharge protection circuit 1 of FIG. 1. The electrostatic discharge protection circuit 6 is different from the electrostatic discharge protection circuit 1 in that the drive circuit 11 of the electrostatic discharge protection circuit 6 does not comprise the NMOS transistor N13 of the electrostatic discharge protection circuit 1. Since the drive circuit 11 of the electrostatic discharge protection circuit 6 does not comprise the NMOS transistor N13, when the core circuit 14 does not operate in the normal operation state and an electrostatic discharge event occurs on the bonding pad 13, the NMOS transistor N10 is in a floating state due to the turned-off state of the PMOS transistor P11. When an electrostatic discharge event occurs on the bonding pad 13, only the NMOS transistor N11 is turned off as described in FIGS. 4A and 4B. The operations of the buffer circuit 10, the other elements of the drive circuit 11, and the power-clamping circuit 12 are the same as the described operations related to FIGS. 2A~4B, and the related description is omitted here.

Figure 7:
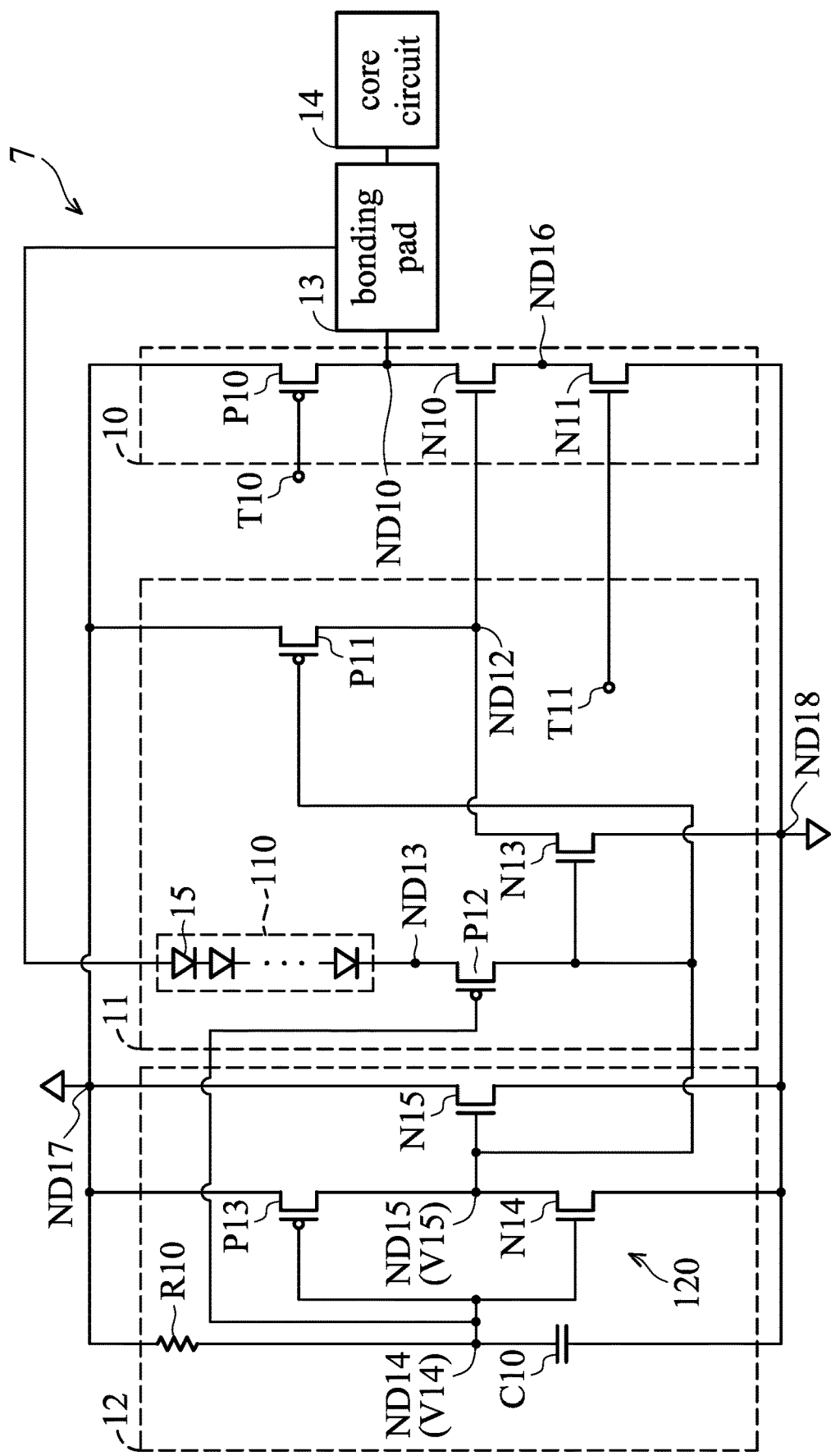
FIG. 7 shows an electrostatic discharge protection circuit according to an exemplary embodiment of the present disclosure.

FIG. 7 shows an electrostatic discharge protection circuit according to another embodiment of the present disclosure. Referring to FIG. 7, the circuit structure of the electrostatic discharge protection circuit 7 is similar to the circuit structure of the electrostatic discharge protection circuit 1 of FIG. 1. The electrostatic discharge protection circuit 7 is different from the electrostatic discharge protection circuit 1 in that the drive circuit 11 of the electrostatic discharge protection circuit 7 does not comprise the NMOS transistor N12 of the electrostatic discharge protection circuit 1. Since the drive circuit 11 of the electrostatic discharge protection circuit 7 does not comprise the NMOS transistor N12, the NMOS transistor N11 is in a floating state when the core circuit 14 does not operate in the normal operation state. When an electrostatic discharge event occurs on the bonding pad 13, only the NMOS transistor N10 is turned off as described in FIGS. 4A and 4B. The operations of the buffer circuit 10, the other elements of the drive circuit 11, and the power-clamping circuit 12 are the same as the described operations related to FIGS. 2A-4B, and the related description is omitted here.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge protection circuit coupled to a bonding pad, comprising:
    a buffer circuit comprising a first transistor and a second transistor having a first conductivity type, which are coupled in a cascade configuration between a first node and a first power supply node, wherein the bonding pad is coupled to the first node;
    a drive circuit receiving a first control voltage and determining a state of at least one of the first transistor and the second transistor according to the first control voltage, wherein the drive circuit comprises:
        a third transistor having a second conductivity type, wherein the third transistor is coupled between a second power supply node and a gate of the first transistor and is controlled by the first control voltage; and
        a fourth transistor having the second conductivity type, wherein the fourth transistor is coupled between a second node and a third node and is controlled by a second control voltage; and
    a power-clamping circuit coupled to the bonding pad through the first node and coupled to a gate of the third transistor at the second node, wherein the power-clamping circuit comprises:
        a pull-up transistor having the second conductivity type, wherein the pull-up transistor is coupled between the second power supply node and the second node and is controlled by the second control voltage,
    wherein the first control voltage is generated at the second node, and the power-clamping circuit determines a level of the first control voltage according to a voltage on the bonding pad.

2. The electrostatic discharge protection circuit as claimed in claim 1, wherein in response to an electrostatic discharge event occurring on the bonding pad, the drive circuit turns off at least one of the first transistor and the second transistor according to the first control voltage.

3. The electrostatic discharge protection circuit as claimed in claim 1,
    wherein the buffer circuit further comprises:
        a fifth transistor having the second conductivity type and coupled between the second power supply node and the first node, and
    wherein the drive circuit further comprises:
        a voltage-lowering circuit coupled between the bonding pad and the third node;
        a sixth transistor having the first conductivity type, wherein the sixth transistor is coupled between the gate of the first transistor and the first power supply node and is controlled by the first control voltage; and
        a seventh transistor having the first conductivity type, wherein the seventh transistor is coupled between a gate of the second transistor and the first power supply node and is controlled by the first control voltage,
    wherein the power-clamping circuit generates the second control voltage in response to the voltage on the bonding pad and determines the level of the first control voltage according to the second control voltage.

4. The electrostatic discharge protection circuit as claimed in claim 3, wherein the power clamping circuit comprises:
    a resistor and a capacitor connected in series between the second power supply node and the first power supply node, wherein the second control voltage is generated at a common node between the resistor and the capacitor;
    and
    a pull-down transistor having the first conductivity type, wherein the pull-down transistor is coupled between the second node and the first power supply node and is controlled by the second control voltage.

5. The electrostatic discharge protection circuit as claimed in claim 1,
    wherein the buffer circuit further comprises:
        a fifth transistor having the second conductivity type and coupled between the second power supply node and the first node, and
    wherein the drive circuit further comprises:
        a voltage-lowering circuit coupled between the bonding pad and the third node;
        and
        a sixth transistor having the first conductivity type, wherein the sixth transistor is coupled between a gate of the second transistor and the first power supply node and is controlled by the first control voltage, wherein the power-clamping circuit generates the second control voltage in response to the voltage on the bonding pad and determines the level of the first control voltage according to the second control voltage.

6. The electrostatic discharge protection circuit as claimed in claim 5, wherein the power clamping circuit comprises:
a resistor and a capacitor connected in series between the second power supply node and the first power supply node, wherein the second control voltage is generated at a common node between the resistor and the capacitor;
and
a pull-down transistor having the first conductivity type, wherein the pull-down transistor is coupled between the second node and the first power supply node and is controlled by the second control voltage.

7. The electrostatic discharge protection circuit as claimed in claim 1,
wherein the buffer circuit further comprises:
a fifth transistor having the second conductivity type and coupled between the second power supply node and the first node, and
wherein the drive circuit further comprises:
a voltage-lowering circuit coupled between the bonding pad and the third node;
and
a sixth transistor having the first conductivity type, wherein the sixth transistor is coupled between the gate of the first transistor and the first power supply node and is controlled by the first control voltage,
wherein the power-clamping circuit generates the second control voltage in response to the voltage on the bonding pad and determines the level of the first control voltage according to the second control voltage.

8. The electrostatic discharge protection circuit as claimed in claim 7, wherein the power clamping circuit comprises:
a resistor and a capacitor connected in series between the second power supply node and the first power supply node, wherein the second control voltage is generated at a common node between the resistor and the capacitor;
and
a pull-down transistor having the first conductivity type, wherein the pull-down transistor is coupled between the second node and the first power supply node and is controlled by the second control voltage.

9. The electrostatic discharge protection circuit as claimed in claim 8,
wherein in an input mode, there is a first operation voltage on the first power supply node, the second power supply node receives a second operation voltage higher than the first operating voltage, the gate of the second transistor receives a first signal voltage, and a gate of the fourth transistor receives a second signal voltage, and
wherein in the input mode, a level of the second signal voltage is higher than a level of the first signal voltage.

10. The electrostatic discharge protection circuit as claimed in claim 8,
wherein in an output mode, there is a first operation voltage on the first power supply node, the second power supply node receives a second operation voltage that is higher than the first operating voltage, the gate of the second transistor receives a first signal voltage, and a gate of the fourth transistor receives a second signal voltage, and
wherein in the output mode, a level of the second signal voltage is higher than a level of the first signal voltage.

11. The electrostatic discharge protection circuit as claimed in claim 8, wherein the second power node does not receive any operation voltage and an electrostatic discharge event occurs on the bonding pad, the drive circuit turns off at least one the first transistor and the second transistor according to at least one of the first control voltage and the second control voltage.

12. An electrostatic discharge protection circuit coupled to a bonding pad, comprising:
a buffer circuit comprising:
a first transistor having a first conductivity type and coupled between a first node and a second node, wherein the bonding pad is coupled to the first node; and
a second transistor having the first conductivity type and coupled between the second node and a first power supply node;
a drive circuit receiving a first control voltage and determining a state of at least one of the first transistor and the second transistor according to the first control voltage, wherein the drive circuit further comprises:
a third transistor having a second conductivity type, wherein the third transistor is coupled between a third node and a fourth node and is controlled by a second control voltage; and
a fourth transistor having the second conductivity type, wherein the fourth transistor is coupled between a second power supply node and a gate of the first transistor and is controlled by the first control voltage; and
a power-clamping circuit coupled to the bonding pad through the first node and coupled to the drive circuit at the third node,
wherein the first control voltage is generated at the third node, and the power-clamping circuit determines a level of the first control voltage according to a voltage on the bonding pad, and
wherein in response to an electrostatic discharge event occurring on the bonding pad, the drive circuit turns off the first transistor according to the first control voltage.

13. The electrostatic discharge protection circuit as claimed in claim 12, wherein in response to the electrostatic discharge event occurring on the bonding pad, the drive circuit further turns off the second transistor according to the first control voltage.

14. The electrostatic discharge protection circuit as claimed in claim 12,
wherein the buffer circuit further comprises:
a fifth transistor having the second conductivity type and coupled between the second power supply node and the first node, and
wherein the drive circuit further comprises:
a voltage-lowering circuit coupled between the bonding pad and the fourth node;
a sixth transistor having the first conductivity type, wherein the sixth transistor is coupled between the gate of the first transistor and the first power supply node and is controlled by the first control voltage; and
a seventh transistor having the first conductivity type, wherein the seventh transistor is coupled between a gate of the second transistor and the first power supply node and is controlled by the first control voltage, wherein the power-clamping circuit generates the second control voltage in response to the voltage on the bonding pad and determines the level of the first control voltage according to the second control voltage.

15. The electrostatic discharge protection circuit as claimed in claim 12, wherein the buffer circuit further comprises:
a fifth transistor having the second conductivity type and coupled between the second power supply node and the first node, and wherein the drive circuit further comprises:
a voltage-lowering circuit coupled between the bonding pad and the fourth node; and
a sixth transistor having the first conductivity type, wherein the sixth transistor is coupled between the gate of the first transistor and the first power supply node and is controlled by the first control voltage, wherein the power-clamping circuit generates the second control voltage in response to the voltage on the bonding pad and determines the level of the first control voltage according to the second control voltage.

* * * * *